United States Patent [19]

Pardo et al.

[11] Patent Number: 4,687,127
[45] Date of Patent: Aug. 18, 1987

[54] AVIONIC TRAY GASKET ASSEMBLY

[75] Inventors: Jacob Pardo, Los Angeles; William S. Jensen, Canoga Park, both of Calif.

[73] Assignee: Barry Wright Corporation, Newton Lower Falls, Mass.

[21] Appl. No.: 716,902

[22] Filed: Mar. 28, 1985

[51] Int. Cl.⁴ .................. F16J 15/02; F16M 13/00; H05K 7/20

[52] U.S. Cl. ...................................... 277/12; 49/489; 49/498; 248/27.1; 248/634; 277/189; 277/212 C; 277/226; 361/383

[58] Field of Search .................. 248/27.1, 632, 634; 312/7.2, 296; 174/153 G; 361/383; 277/177, 178, 184, 12, 189, 226, 212 C; 220/354, 357, 358; 248/632, 634; 49/485, 489, 490, 498

[56] References Cited

U.S. PATENT DOCUMENTS

| 2,352,591 | 6/1944 | Wallerstein, Jr. | 248/27.1 X |
| 2,622,286 | 12/1952 | Beck | 49/489 X |
| 2,679,075 | 5/1954 | Bradley . | |
| 2,717,748 | 9/1955 | Martinet | 248/634 |
| 2,793,070 | 5/1957 | Wernig | 49/489 X |
| 2,952,053 | 9/1960 | Frehst | 49/489 |
| 3,085,664 | 4/1963 | Adams et al. | 312/296 X |
| 3,223,276 | 12/1965 | Gebhardt et al. | 312/296 X |
| 3,656,260 | 4/1972 | Weaver et al. | 49/498 X |
| 3,771,023 | 11/1973 | Hollingsead et al. | 277/178 X |
| 3,871,937 | 3/1975 | Hollingsead et al. | 277/178 X |
| 4,044,515 | 8/1977 | Hollingsead et al. | 277/178 X |
| 4,243,262 | 1/1981 | Tokunaga et al. | 49/485 X |
| 4,312,558 | 1/1982 | Duerr et al. | 248/27.1 X |
| 4,458,296 | 7/1984 | Bryant et al. | 361/383 |

FOREIGN PATENT DOCUMENTS

| 864343 | 1/1953 | Fed. Rep. of Germany . | |
| 887308 | 8/1953 | Fed. Rep. of Germany . | |
| 1032988 | 6/1958 | Fed. Rep. of Germany . | |
| 1032627 | 6/1958 | Fed. Rep. of Germany . | |
| 1094536 | 12/1960 | Fed. Rep. of Germany . | |
| 1187871 | 2/1965 | Fed. Rep. of Germany . | |
| 1425493 | 1/1974 | Fed. Rep. of Germany . | |
| 630827 | 10/1949 | United Kingdom . | |
| 980336 | 1/1965 | United Kingdom | 248/634 |

Primary Examiner—Allan N. Shoap
Attorney, Agent, or Firm—Hamilton, Brook, Smith & Reynolds

[57] ABSTRACT

An avionic tray assembly comprising a tray (12) having upper and lower surfaces (28, 30) with an opening (24) is formed in the tray to let the passage of air therethrough. A U-shaped channel member (26) is secured to the lower surface of the tray beneath the peripheral edge (40) of the opening with the opening located above a central portion of the channel to create an overhanging lip above the channel. An elastomeric gasket is located in the channel with a lower portion occupying substantially all of the space within the channel and beneath the overhanging lip and an upper portion extending out of the channel and above the surface of the tray to engage and support an object positioned above the opening in the tray.

3 Claims, 8 Drawing Figures

AVIONIC TRAY GASKET ASSEMBLY

FIELD OF THE INVENTION

The present invention relates to avionic racking in general and more particularly to tray gasket assemblies utilized in mounting and sealing electronic instruments on shelves.

BACKGROUND

In aircraft, most electronic equipment is supported on an individual tray which, in turn, is supported at its front and back ends on a pair of cross beams which thus forms a shelf for equipment. The over all size of the trays is standard but the trays accomodate various sizes of instruments. An example of this type of racking or shelving is shown in U.S. Pat. No. 4,458,296 to Bryant et al.

In a typical shelf, a number of trays are closely spaced on the cross beams. Beneath the cross beams and directly below the trays are one or more air plenum chambers to supply cooling air to the instruments and to return heated air after it has passed through the instruments. The return plenum chambers of each shelf communicate with a manifold located at the ends of the shelves which in turn is connnected to a vacuum system.

The outer casing of each electronic instrument is provided with air vents at the top and bottom of the sides to permit cooling air to be drawn through the instruments.

Each tray includes an opening, either with or without a plate, over which the instrument is positioned. Some trays have one or more metering ports in the plates through which cooling air passes. A peripheral gasket is secured around the opening in each tray with its upper portion extending above the upper surface of the tray to sealingly engage the bottom of the electronic instrument supported on the tray and to reduce noise and vibration. With this type of construction, air from beneath the instrument is prevented from leaking past the instrument and, as a result, only the cooling air which is drawn into the system passes through the instrument. An example of this type of tray construction is disclosed in U.S. Pat. Nos. 3,771,023, 3,871,937, 4,044,515 to Hollingsead et al.

A problem exists with the seals of this type of construction when electronic equipment boxes are placed on the tray. When the box is slid or moved on to the tray or removed therefrom, often times the gasket material disengages from the tray and/or the metering plate if one is used with the tray. This not only permits the leakage of cooling air but creates an unstable support for the instrument.

Accordingly, it is an object of this invention to provide an avionic tray gasket assembly which will not disengage or become dislodged when electronic equipment boxes are placed on or removed from the trays.

SUMMARY OF THE INVENTION

The invention resides in an avionic tray assembly which includes a tray which has an upper and a lower surface. There is an opening in the tray to permit the passage of air therethrough. A channel member is secured to the lower surface of the tray beneath the peripheral edge of the opening so that the opening is located above a central portion of the channel whereby the tray creates an overhanging lip above some but not all of the channel.

A flexible, elastomeric gasket is located in the channel. It has a lower portion which has substantially the same cross section as that of the channel occupying virtually all of the space within the channel. It is positioned beneath the overhanging lip. The gasket also has a narrower upper portion extending out of the channel and above the upper surface of the tray to engage, support and seal the equipment above the opening in the tray.

Thus, the tray and the channel together cooperate to hold the gasket in place.

The diameter of the opening in the tray is greater than the diameter of the figure defined by one leg of the channel and smaller than the diameter of the figure defined by of the other leg, or stating it in the alternative, the channel has a first upstanding portion located within the diameter of the opening and a second upstanding portion located outside of the diameter of the opening.

Since the gap between the overhanging lip of the tray and the first or inside portion of the channel is less than the width of the channel itself, and since the lower portion of the elastomeric gasket is of a width approximating that of the channel but wider than the gap, the gasket thereby is constrained within the channel on all four sides.

The above and other features of the invention including various novel details of construction and combinations of parts will now be more particularly described with reference to the accompanying drawings and pointed out in the claims. It will be understood that the particular avionic tray gasket assembly embodying the invention is shown by way of illustration only and not as a limitation of the invention. The principles and features of this invention may be employed in varied and numerous embodiments without departing from the scope of the invention.

DESCRIPTION OF THE PREFERRED EMBODIMENT

Figure 1:
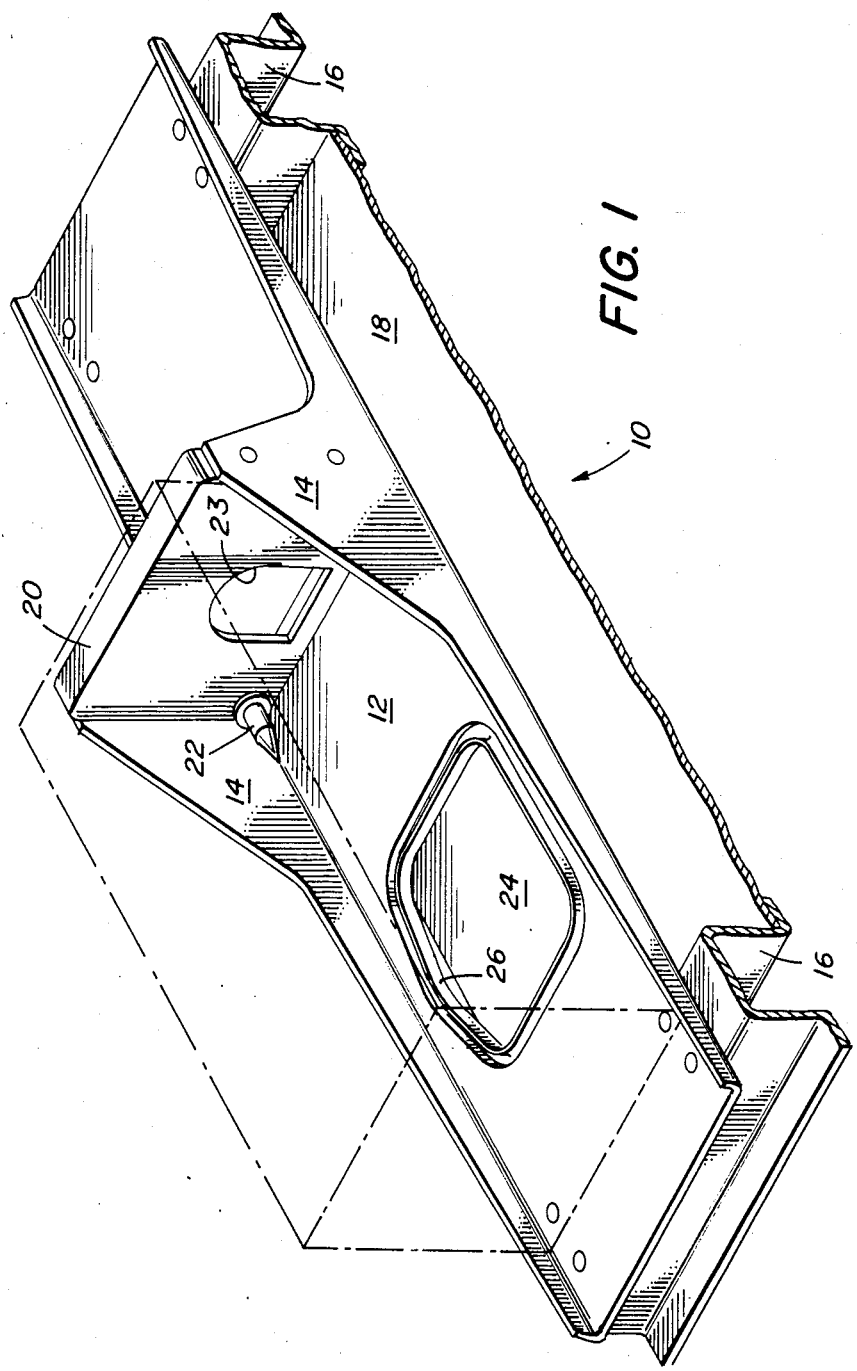
FIG. 1 is a perspective view of an avionic tray embodying the invention positioned on a shelf.

FIG. 1 shows an avionic tray 10 similar to and embodying many of the features of the prior art as improved upon by the present invention. The tray supports an electronic instrument which is shown in broken lines. The tray has a bottom 12 and a pair of side rails 14. The bottom 12 of the tray is supported at its ends on a pair of cross beams 16. While only one tray is shown in FIG. 1, the entire length of the channels 16 will be covered with similar trays to form a shelf for the electronic instruments. The cross beams 16 are joined by a plate 18 to enclose the space below the trays and thus form an air plenum chamber. The plenum chamber and others like it are connected to a manifold (not shown) located at one end of the shelf.

The side rails 14 help to guide the instrument as it is slid onto the tray. A back plate 20 locates the instrument lengthwise of the tray. One or more guide pins 22 are employed to engage with a mating portion on the instrument to assure that the instrument is accurately located on the tray. A portion 23 of the back plate 20 is cut out to permit an electrical receptacle (not shown) to plug into the electronic instrument.

An opening 24 is formed in the bottom of the tray and a channel member 26 is secured to the lower surface of the tray around the perimeter of the opening 24. The shape of the opening 24 is dictated by the shape of the electronic instrument that is to be supported on the tray. The shape of the cross section of the channel may be, for example, semicircular or a truncated triangle, etc. However, it is shown for illustrative purposes as U-shaped.

Figure 5A:
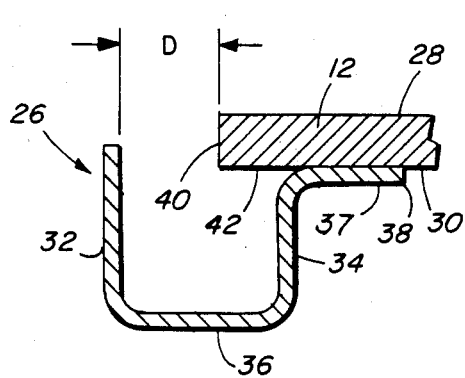
FIGS. 5A, 5B, 5C, and 5D show the gasket, tray and channel in cross section; with no gasket in place in FIG. 5A; with a gasket being inserted in FIG. 5B; the gasket fully in place in FIG. 5C and the gasket in place supporting a piece of electronic equipment in FIG. 5D.
Figure 5B:
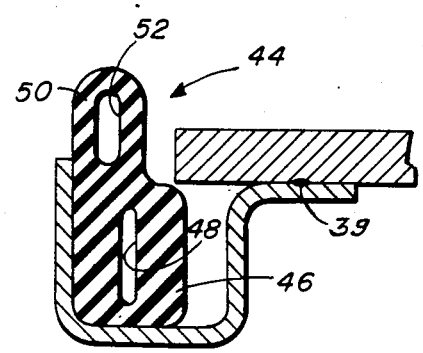
Figure 5C:
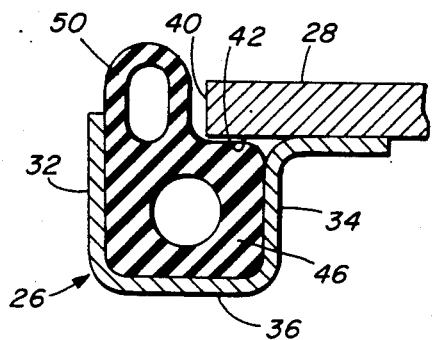

Referring to FIGS. 2 and 5A through 5D, the tray 12 has an upper surface 28 and a lower surface 30. The channel 26 is generally U-shaped in cross section having a first upstanding portion or leg 32 and a second upstanding portion or leg 34 joined at the bottom by a bridging portion 36. Extending laterally from the upstanding leg 34, is a flange 37 terminating at 38. The flange is secured to the lower surface 30 of the tray by spot welding 39 or the like (FIG. 5B). The peripheral edge 40 of the opening 12 is positioned above the channel 26 intermediate but not necessarily centrally between the upstanding legs 32, 34. Whereas the channel 26 is shown extending completely around the periphery of the opening 24, it is within the scope of this invention that the channel may be interrupted at one or more places.

Figure 2:
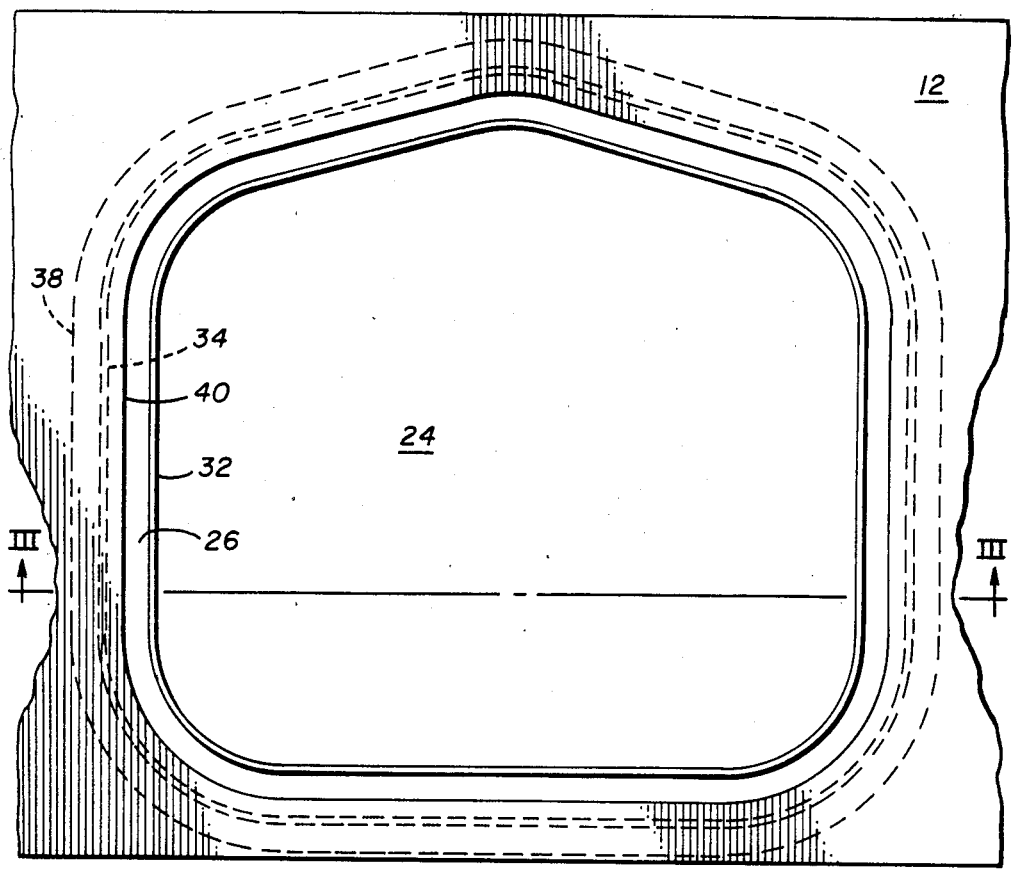
FIG. 2 is a top plan view of the avionic tray.
Figure 3:
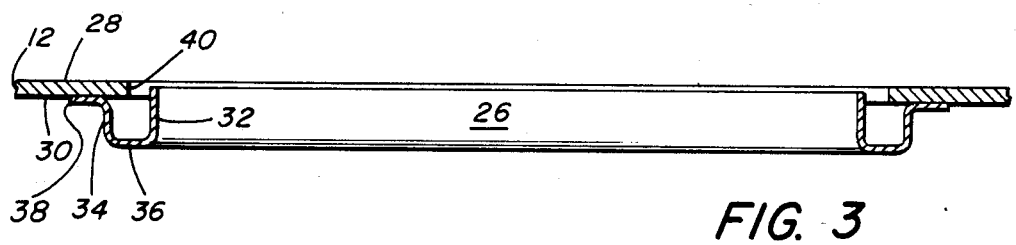
FIG. 3 is a section taken on the line III—III of FIG. 2.

Since the peripheral edge 40 of the opening is located above a generally central portion of the channel 26, it will be seen that the first upstanding leg 32 is located within the diameter of the opening 24 and the second upstanding leg 34 is located outside the diameter of the opening. Therefore, as seen in FIG. 2, the diameter of the opening 24 in the tray is greater than the diameter of the figure defined by the leg 32 and smaller than diameter of the figure defined by the upstanding leg 34. The result is that the tray forms a lip 42 which overhangs the channel.

Figure 4:
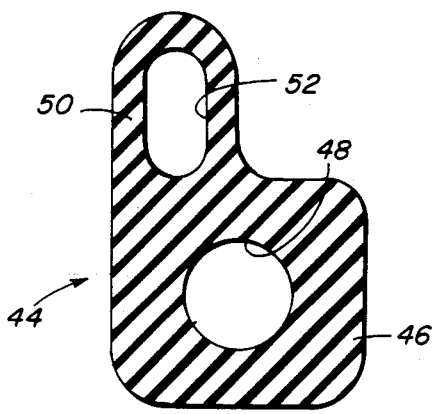
FIG. 4 is a cross section of the gasket on an enlarged side.

Referring to FIG. 4 an elastomeric gasket, generally indicated 44, will be seen having a lower portion 46 having a cross section similar to that of the channel. There is a hole 48 in this portion of the gasket. An upper portion 50 is contiguous with and extends upwardly from the left hand or radially inward side of the lower portion of the gasket 44. The upper portion also contains a hole 52 and its upper surface is curvilinear in cross section. The width of the portion 46 of the gasket is approximately the width of the channel 26 measured between the legs 32 and 34. The width of the upper portion 50 is approximately half the width of the lower portion 46 and slightly less than the distance D (FIG. 5A) which is the gap between the upstanding leg 32 and the peripheral edge 40 of the opening 24. As seen in FIG. 5B, the elastomeric gasket is compressed laterally to allow the lower portion 46 to be inserted into the channel 26. Thereafter, the gasket expands to occupy the position shown in FIG. 5C, wherein the lower portion 46 of the gasket occupies virtually all of the space within the channel 26 beneath the overhanging lip 42 of the tray. The upper portion 50 of the gasket, extends out of the channel and above the upper surface 28 of the tray in position to engage, support, and seal a piece of electronic equipment, indicated as 52, above the upper surface 28 of the tray.

Figure 5D:
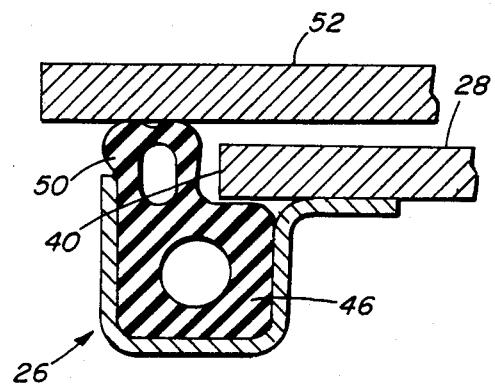

The upper portion 50 of the gasket is slightly compressed by the weight of the electronic equipment 52 as shown in FIG. 5D, but the equipment does not engage the upper surface 28 of the tray, thus avoiding metal-to-metal contact. This results in an airtight seal being formed between the electronic box and the gasket completely around the periphery of the opening 24. The seal also results in a reduction of noise. Because of the configuration of the channel 26 and the presence of the overhanging lip 42, the gasket 46 is supported from beneath by the bridging member 36, laterally by the legs 32, 34 and it is prevented from moving out of the channel by the overhanging lip 42 of the tray.

We claim:

1. An avionic tray assembly comprising:
   a. a tray having upper and lower substantially horizontal surfaces;
   b. an opening in the tray to permit the passage of air therethrough;
   c. an upwardly opening, U-shaped channel member secured to the lower surface of the tray beneath the peripheral edge of the opening, said U-shaped channel member having inner and outer legs with the inner leg being closer to the center of the opening;
   the peripheral edge of the opening being located vertically above a central portion of the U-shaped channel member, whereby a portion of the tray is an overhanging lip above the U-shaped channel member with the outer leg of the U-shaped channel member being under said tray in a plane intersecting the lower substantially horizontal surface of the tray and with the inner leg of the U-shaped channel member being spaced from said peripheral edge; and
   d. a gasket located in the U-shaped channel member;
   the gasket having a hollow lower portion occupying substantially all of the space within the U-shaped channel member,
   a surface on the lower portion of the gasket located beneath the overhanging lip,
   a hollow upper portion which is narrower than the lower portion and which extends upwardly from said surface and out of the U-shaped channel member,
   the upper portion of the gasket extending above the upper surface of the tray to engage and support an object above the opening in the tray, said inner leg having its upper edge generally opposite said peripheral edge, said gasket having a radially, inwardly facing peripheral surface defining such surface for said upper and lower portions, said inner leg being juxtaposed to and in contact with said peripheral surface for the extent of said inner leg including a part of the peripheral surface of said upper portion,
   the characteristics of the seal being such that the object that it is adapted to support remains spaced above the top surface of the tray while slightly compressing in deformation the upper portion of the seal.

2. An avionic tray assembly comprising:
   a. a tray having upper and lower substantially horizontal surfaces;

b. an opening in the tray to permit the passage of air therethrough;

c. an upwardly opening, U-shaped channel member secured to the lower surface of the tray beneath the peripheral edge of the opening and having two, substantially vertical legs;

the diameter of the opening in the tray being greater than the diameter of the figure formed by one leg of the U-shaped channel member and smaller than the diameter of the figure defined by the other leg of the U-shaped channel member, whereby a portion of the tray is an overhanging lip above the U-shaped channel member with said other leg of the U-shaped channel member being under said tray in a plane intersecting the lower substantially horizontal surface of the tray and with said one leg of the U-shaped channel member being spaced from said peripheral edge; and d. a gasket located in the U-shaped channel member, the gasket having a hollow lower portion occupying substantially all of the space within the U-shaped channel member, a surface on the lower portion of the gasket located beneath the overhanging lip, a hollow upper portion which is narrower than the lower portion and which extends upwardly from said surface and out of the U-shaped channel member, the upper portion of the gasket extending above the upper surface of the tray to engage and support an object above the opening in the tray, said one leg having its upper edge generally opposite said peripheral edge, said gasket having a radially, inwardly facing peripheral surface defining such surface for said upper and lower portions, said one leg being juxtaposed to and in contact with said peripheral surface for the extent of said one leg including a part of the peripheral surface of said upper portion, the characteristics of the seal being such that the object that it is adapted to support remains spaced above the top surface of the tray while slightly compressing in deformation the upper portion of the seal.

3. An avionic tray assembly comprising:

a. a tray having upper and lower substantially horizontal surfaces;

b. an opening in the tray to permit the passage of air therethrough;

c. an upwardly opening, U-shaped channel member secured to the lower surface of the tray beneath the peripheral edge of the opening;

the U-shaped channel member having a first, substantially vertical, upstanding leg located within the diameter of the opening in the tray and a second, substantially vertical, upstanding leg located outside the diameter of the opening in the tray, whereby a portion of the tray is an overhanging lip above the U-shaped channel member with the second leg of the U-shaped channel member being under said tray in a plane intersecting the lower substantially horizontal surface of the tray and with the first leg of the U-shaped channel member being spaced from said peripheral edge; and d. a gasket located in the U-shaped channel member;

the gasket having a hollow lower portion occupying substantially all of the space within the U-shaped channel member, a surface on the lower portion of the gasket located beneath the overhanging lip, a hollow upper portion which is narrower than the lower portion and which extends upwardly from said surface and out of the U-shaped channel member;

the upper portion of the gasket extending above the upper surface of the tray to engage and support an object above the opening in the tray, said first leg having its upper edge generally opposite said peripheral edge, said gasket having a radially, inwardly facing peripheral surface defining such surface for said upper and lower portions, said first leg being juxtaposed to and in contact with said peripheral surface for the extent of said first leg including a part of the peripheral surface of said upper portion;

the characteristics of the seal being such that the object that it is adapted to support remains spaced above the top surface of the tray while slightly compressing in deformation the upper portion of the seal.

* * * * *